United States Patent
Zheng

(10) Patent No.: US 9,220,161 B2
(45) Date of Patent: Dec. 22, 2015

(54) ARRAY SUBSTRATE AND PANEL

(71) Applicants: Shanghai Tianma Micro-Electronics Co., Ltd., Shanghai (CN); Tianma Micro-Electronics Co., Ltd., Shenzhen (CN)

(72) Inventor: Lipeng Zheng, Shanghai (CN)

(73) Assignees: Shanghai Tianma Micro-Electronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 31 days.

(21) Appl. No.: 14/090,889

(22) Filed: Nov. 26, 2013

(65) Prior Publication Data
US 2014/0240889 A1    Aug. 28, 2014

(30) Foreign Application Priority Data
Feb. 22, 2013   (CN) .......................... 2013 1 0057816

(51) Int. Cl.
*H02H 9/00* (2006.01)
*H05F 3/02* (2006.01)
*G02F 1/1362* (2006.01)
*H01L 27/02* (2006.01)
*H01L 27/12* (2006.01)

(52) U.S. Cl.
CPC ............ *H05F 3/02* (2013.01); *G02F 1/136204* (2013.01); *H01L 27/0288* (2013.01); *H01L 27/0296* (2013.01); *H01L 27/124* (2013.01); *G02F 2201/50* (2013.01); *G09G 2330/04* (2013.01)

(58) Field of Classification Search
USPC .......................... 361/56, 111; 349/40, 43, 54
See application file for complete search history.

(56) References Cited

U.S. PATENT DOCUMENTS

| 2002/0101547 A1 * | 8/2002 | Lee et al. ....................... 349/40 |
| 2005/0272240 A1 | 12/2005 | Huang |

(Continued)

FOREIGN PATENT DOCUMENTS

| CN | 1228669 A | 9/1999 |
| CN | 1539093 A | 10/2004 |

OTHER PUBLICATIONS

Extended European Search Report from corresponding European Application No. 13194221.1, mailed on May 19, 2014, 6 pages total.

*Primary Examiner* — Danny Nguyen
(74) *Attorney, Agent, or Firm* — Alston & Bird LLP

(57) ABSTRACT

An array substrate includes a common electrode line located in a surrounding region, a protected structure located inside the common electrode line, and a first electrostatic protection circuit having a shorting bar electrically connected between the protected structure and the common electrode line for releasing static electricity on the protected structure. A second electrostatic protection circuit is also electrically connected between the protected structure and the common electrode line, and the second electrostatic protection circuit releases static electricity through the common electrode line after the shorting bar is cut off. The invention can make the conduction of the static electricity accumulated at the shorting bar that has been cut off change from unidirectional conduction toward inside of the array substrate to bidirectional conduction toward inside of the array substrate and edges of the array substrate, thus reducing the probability of electrostatic damage to internal devices of the array substrate.

18 Claims, 6 Drawing Sheets

(56) References Cited

U.S. PATENT DOCUMENTS

2006/0145951 A1* 7/2006 Watanabe et al. .............. 345/55
2007/0184598 A1 8/2007 Huang
2008/0079859 A1 4/2008 Ota
2008/0259009 A1 10/2008 Gao

* cited by examiner

ARRAY SUBSTRATE AND PANEL

CROSS-REFERENCES TO RELATED APPLICATIONS

This application claims the benefit of priority of Chinese Patent Application No. 201310057816.3, entitled "Array Substrate and Panel", filed with the Chinese Patent Office on Feb. 22, 2013, the contents of which is incorporated herein by reference in its entirety.

FIELD OF THE INVENTION

The invention relates to the field of flat panel display and flat panel image sensor, and particularly to a flat panel display or an array substrate thereof used in a flat panel image sensor and a corresponding panel.

BACKGROUND OF THE INVENTION

At present, the technology in flat panel display and flat panel image sensing has entered a stage of rapid development, and various new techniques applied to the field of flat panel display and flat panel image sensing are becoming one of the current research focuses. In the manufacturing process of an array substrate, the static electricity is a strong opponent in improving the yield and manufacturing a qualified array substrate, therefore various accompanied ESD (Electro-Static discharge) protection circuit has come into being.

In the prior art, usually a shorting bar 3 is electrically connected between a common electrode line 1 located in the surrounding region of an array substrate and a protected metal wire 2 to solve the difficulty of electrostatic releasing, as shown in FIG. 1a. In manufacturing process of an array substrate, a protected metal wire 2 is electrically connected to the common electrode line 1 via the shorting bar 3 in order to prevent static electricity. Specifically, as shown in FIG. 1b, the common electrode line 1 and the protected metal wire 2 located on a transparent substrate and originally disconnected from each other are electrically connected together via a conducting material 4, so that charges accumulated on the protected metal wire 2 are released to the common electrode line 1 via the conducting material 4, thus the charges can spread in a wide range, thereby reducing the risk of electrostatic damage in the manufacturing process of the array substrate and thus achieving electrostatic protection. Until near the end of the manufacturing process, an insulating film 5 covering the conducting material 4 is etched to form a via hole; then the conducting material 4 exposed by the via hole is etched so that the conducting material 4 after etching becomes two parts insulated from each other, as shown in FIG. 1c. Finally, a new insulating film 6 is used to cover the structure to protect the structure. And in this way, at the end of the manufacturing process of the array substrate, the purpose of electrically insulating the protected metal wire 2 from the common electrode line 1, i.e. disconnecting the shorting bar in order to make all the protected metal wires 2 operate normally is achieved.

However, in the actual manufacturing process of an array substrate, the via hole that is formed by the etching for disconnecting the shorting bar 3 is relatively deep, and the film quality of the insulating film 6 that is newly formed after the etching for covering is relatively loose at the place near the via hole; and in the process of using a panel, especially during holding and taking the panel, electrostatic discharge is prone to occur at this place, and at this time, the shorting bar does not have the function of electrostatic protection due to being cut off, thus easily leading to electrostatic damage to devices; moreover, the scrapping of good products caused by external static electricity, for example, external static electricity brought by FPC (flexible printed circuit) brought into the panel also should not be underestimated.

BRIEF SUMMARY OF THE INVENTION

Specifically, an array substrate provided by the embodiments of the invention includes a common electrode line located in a surrounding region, a protected structure located inside the common electrode line, and a shorting bar electrically connected between the protected structure and the common electrode line for releasing static electricity on the protected structure, wherein a second electrostatic protection circuit is also electrically connected between the protected structure and the common electrode line, and the second electrostatic protection circuit releases static electricity through the common electrode line after the shorting bar is cut off.

The embodiments of the invention also provide a panel including any one of array substrates described above.

The array substrate described in the embodiments of invention can be used not only for a display panel, but also for an image sensor panel.

DETAILED DESCRIPTION OF THE INVENTION

To make the objects, features and advantages described above more apparent and easy to be understood, specific embodiments of the invention are illustrated in detail hereinafter in conjunction with the drawings.

Many specific details are illustrated in the following description for the thorough understanding of the invention. However, other ways different from ways described herein can also be used to implement the invention, thus the invention is not limited to the specific embodiments disclosed below.

The invention provides an array substrate including a common electrode line located in a surrounding region, a protected structure located inside the common electrode line and a shorting bar electrically connected between the protected structure and the common electrode line for releasing static electricity on the protected structure. A second electrostatic protection circuit is also electrically connected between the protected structure and the common electrode line, and the second electrostatic protection circuit releases static electricity through the common electrode line after the shorting bar is cut off. The shorting bar of the embodiment of the invention is used for rapidly releasing charges accumulated on the protected structure in the manufacturing process of an array substrate, and charges can be rapidly released to the common electrode line through the shorting bar, thus preventing the electrostatic damage caused by accumulation of static electricity rapidly and efficiently. Moreover, the static electricity prevented in the embodiments of the invention may be static electricity accumulated on the shorting bar, or may be static electricity accumulated on the second electrostatic protection circuit, or may be static electricity conducted into the array substrate from other external circuits. Several second electrostatic protection circuits in different forms will be specifically illustrated in the following embodiments.

First Embodiment

Figure 1A:
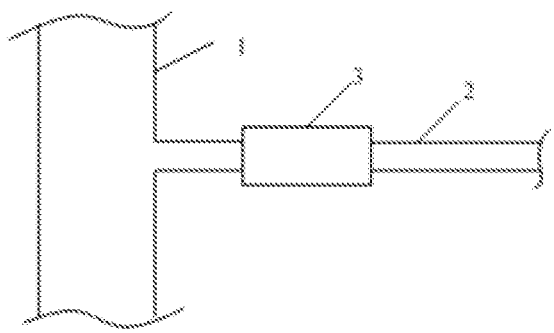
FIG. 1a is a schematic diagram of a connection relation of a shorting bar in the prior art.
Figure 1B:
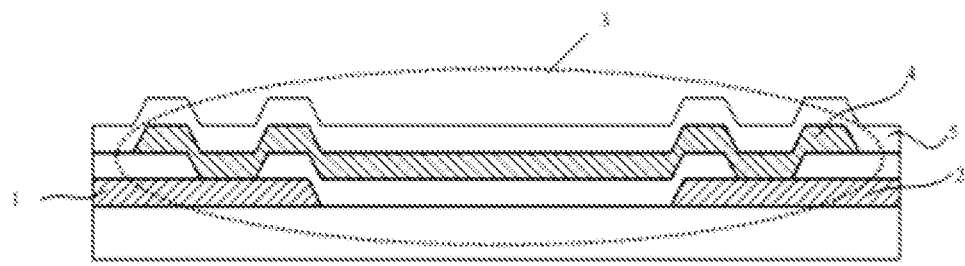
FIG. 1b is a schematic diagram of a cross-section of the shorting bar in the manufacturing process of the array substrate in the prior art.
Figure 1C:
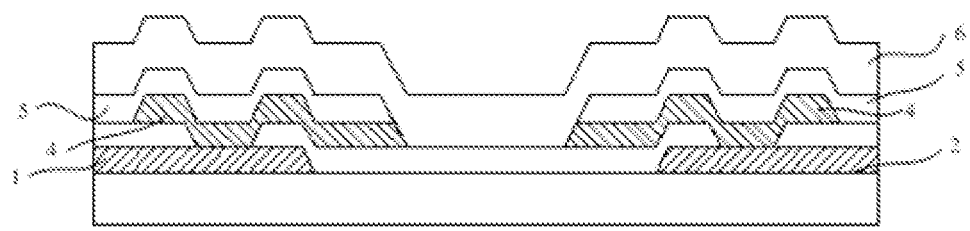
FIG. 1c is a schematic diagram of a cross-section of the shorting bar at the end of the manufacturing process of the array substrate in the prior art.
Figure 2A:
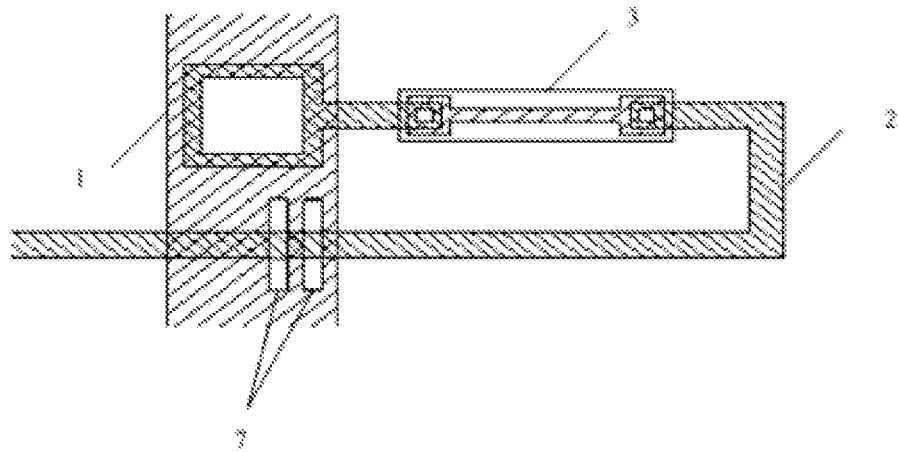
FIGS. 2a to 2d are schematic diagrams of a first embodiment of the invention.
Figure 2B:
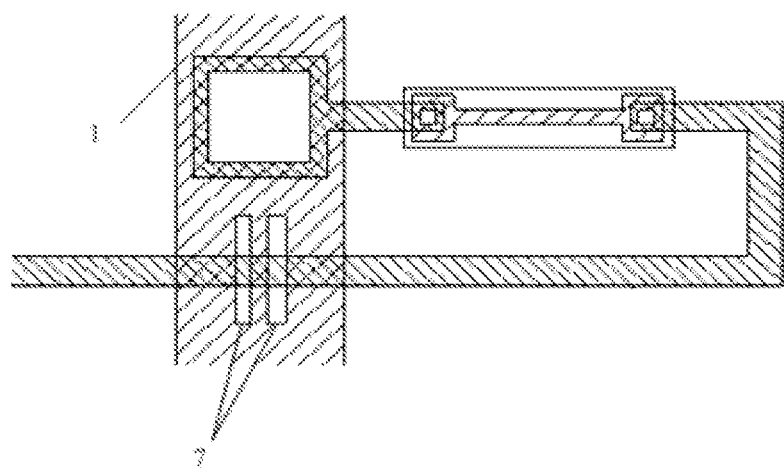
Figure 2C:
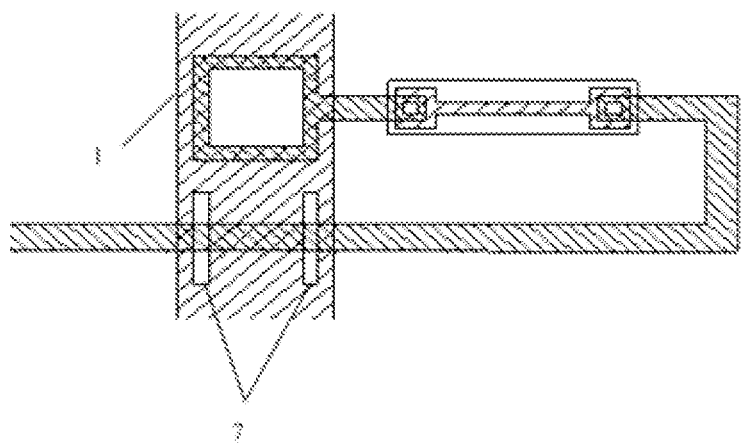
Figure 2D:
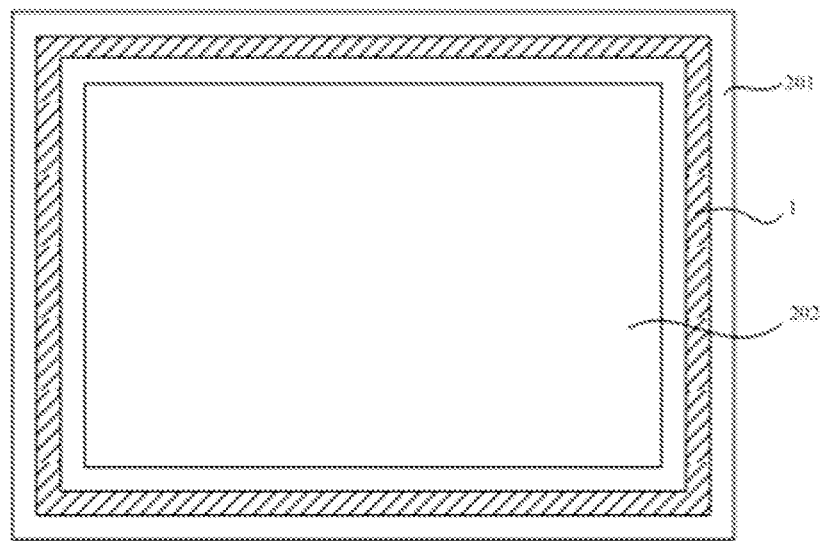

As shown in FIG. 2d, the array substrate includes an array region 202 located in the central region of the array substrate and a surrounding region 201 surrounding the array region 202, and the array region 202 is located inside the surrounding region 201. As shown in FIG. 2a, the array substrate further includes a common electrode line 1 located in the surrounding region 201, a protected structure 2 located inside the common electrode line 1, and a first electrostatic protection circuit having a shorting bar 3 electrically connected between the protected structure 2 and the common electrode line 1 for releasing static electricity on the protected structure 2, and the shorting bar 3 is provided on a side of the common electrode 1 that is far away from the central region of the array substrate. The protected structure 2 overlaps with the common electrode line 1, and the common electrode line 1 includes at least one hollow-out region 7 in the overlapping region. A second electrostatic protection circuit is connected between the protected structure 2 and the common electrode line 1. The second electrostatic protection circuit includes at least one capacitor formed by the protected structure 2 and the common electrode line 1 which overlap with each other. The second electrostatic protection circuit releases static electricity through the common electrode line 1 after the shorting bar 3 is cut off.

It should be noted that, the protected structure 2 in FIG. 2a is located inside the common electrode line 1, however, in terms of macroscopic meaning, it does not mean that the protected structure 2 is absolutely and completely surrounded by the common electrode line 1, but it means that most of the protected structure 2 is provided inside the common electrode line 1 (the surrounded part of the protected structure 2 is not shown in Figure). And it should be understood that, it also includes the case as shown in FIG. 2a that a small part is located outside the common electrode line 1.

In the embodiment, the shorting bar 3 is provided on a side of the common electrode line 1 that is far away from the central region of the array substrate, i.e., the shorting bar 3 is closer to the external circuit such as an FPC compared with being provided in the array region 202, such that the static electricity conducted into the array substrate from the external circuit can be released with priority, thus more rapidly and timely avoiding damage to the array substrate caused by the static electricity conducted into the array substrate from the external circuit.

Moreover, for clear illustration, the protected structure 2 here is indicated by only a wire, but it can be flexibly defined in practice, and all circuits in need of protection are the protected structure 2 indicated here. Similarly, for clear illustration, only two hollow-out regions 7 are schematically showed in FIG. 2a, however, those skilled in the art should understand that it will not be limited thereto.

Moreover, in all embodiments of the invention, an insulating film is provided at the overlapping location between the common electrode line 1 and the protected structure 2, and is used to make the common electrode wire 1 and the protected structure 2 electrically insulated from each other, and this will not be repeated in the following embodiments.

In the embodiment, the shorting bar 3 is placed at the periphery of the common electrode line 1, and the protected structure 2 overlaps with the common electrode line 1. And by dividing the common electrode line 1, one or more capacitors are formed by a side of the common electrode line 1 that is far away from the central region of the array substrate together with the protected structure 2. When static electricity is generated at the shorting bar 3 after shorting bar 3 is cut off, the static electricity make the capacitor broken down, so that the common electrode 1 and the protected structure 2 are shorted and thus the static electricity diffuses through the common electrode line 1, thereby preventing the protected structure 2 from being damaged by static electricity. When the electrostatic breakdown occurs, the protected structure 2 can operate normally by isolating the capacitor where the electrostatic breakdown occurred.

In the embodiment, the hollow-out region 7 is located on a side of the common electrode line 1 that is far away from the central region of the array substrate. And in a modification of the embodiment, the hollow-out region 7 can also be located in the central region of the common electrode line 1 as shown in FIG. 2b; or the hollow-out region 7 is located at edges on both sides of the common electrode line 1 as shown in FIG. 2c. Similarly, the number of the hollow-out region 7 is not limited to 2 as shown in Figure.

It should be noted that, for the case shown in FIG. 2b that the hollow-out region 7 is located in the central region of the common electrode line 1, when static electricity is generated or accumulated at the shorting bar 3 or the protected structure 2, relatively weak static electricity will be filtered by a capacitor with larger capacity formed by the common electrode line 1 and the protected structure 2, thereby protecting the capacitor with smaller capacity from being damage; however, relatively strong static electricity will make the capacitor with smaller capacity broken down. Therefore, such arrangement structure can also be independently applied to a wire having relatively stable signals thereon, such as a ground wire, a common electrode line etc., to filter or release static electricity on these wires, and such arrangement structure is a preferred solution of the embodiment.

Second Embodiment

Figure 3A:
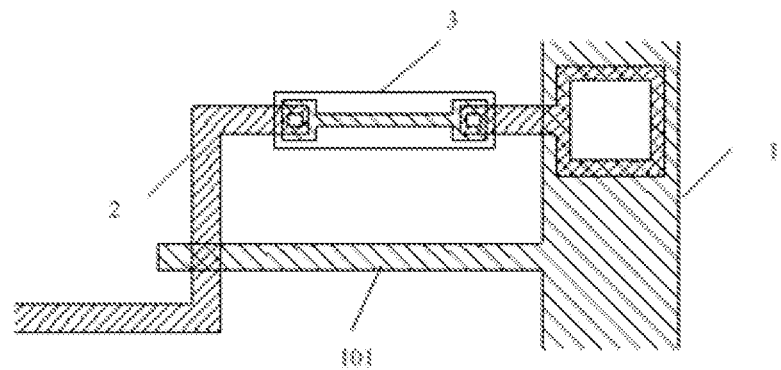
FIGS. 3a to 3c are schematic diagrams of a second embodiment of the invention.

As shown in FIG. 3a, the array substrate includes a common electrode line 1 located in a surrounding region, a protected structure 2 located inside the common electrode line 1, and a shorting bar 3 electrically connected between the protected structure 2 and the common electrode line 1 for releasing static electricity on the protected structure 2. The shorting bar 3 is provided on a side of the common electrode line 1 that is close to a central region of the array substrate, the common electrode line 1 includes at least one first branch 101. A second electrostatic protection circuit is also electrically connected between the protected structure 2 and the common electrode line 1, and the second electrostatic protection circuit includes a capacitor formed by the first branch 101 and the protected structure 2 which overlap with each other. The second electrostatic protection circuit releases static electricity through the common electrode line 1 after the shorting bar 3 is cut off.

It should be noted that, in the embodiment, the common electrode line 1 includes at least one first branch, and only one first branch 101 is schematically illustrated in FIG. 3a, but the common electrode line 1 can also include two or more first branches and the two or more first branches overlap with the protected structure 2 respectively so that two or more capacitors are formed accordingly. Therefore, the invention should not be limited to the case illustrated in FIG. 3a.

Figure 3B:
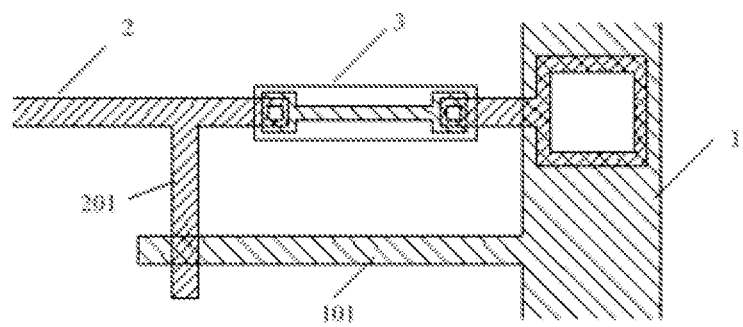

In one modification of the embodiment, as shown in FIG. 3b, the protected structure 2 includes at least one second branch 201, the second electrostatic protection circuit includes a capacitor formed by the first branch 101 and the second branch 201 of the protected structure 2 which overlap with each other. Similarly, the second branch 201 here can also be two or more, and the two or more second branches overlap with the first branch 101 respectively to form two or more capacitors, therefore the invention should not be limited to the case illustrated in FIG. 3b.

In the embodiment, the shorting bar 3 is placed inside the common electrode line 1, the protected structure 2 or its branch overlaps with the common electrode line 1 to form one or more capacitors. When static electricity is generated or accumulated at the shorting bar 3 or the protected structure 2 after the shorting bar 3 is cut off, the static electricity makes these capacitors broken down, and the static electricity diffuses through the common electrode line 1, thereby preventing the protected structure 2 from being damaged by static electricity. Afterwards, the protected structure 2 can operate normally by isolating the broken-down capacitors.

Figure 3C:
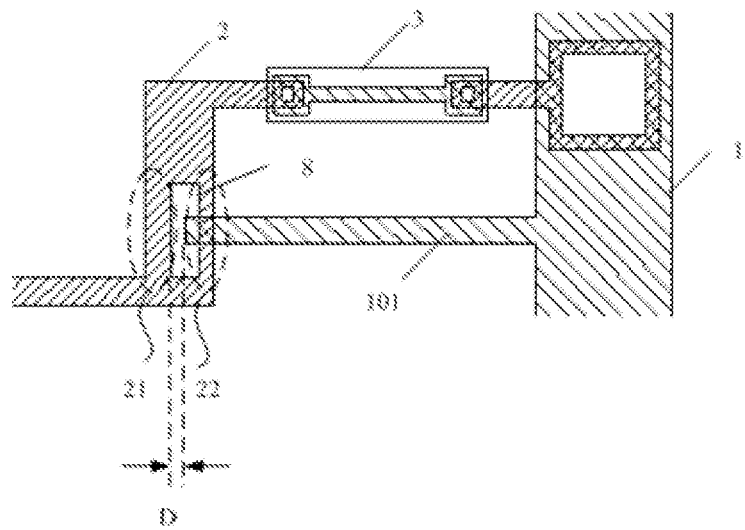

Further, the embodiment can be further modified. Specifically, as shown in FIG. 3c, the protected structure 2 includes one hollow-out region 8, the section of the protected structure that is hollowed out is divided into a first part 21 and a second part 22 by the hollow-out region 8, the first branch 101 overlaps with the second part 22 and does not overlap with the first part 21, the second electrostatic protection circuit includes a point discharge structure formed by the first part 21 and the first branch 101.

By means of dividing the protected structure 2 by the hollow-out region 8 and making the protected structure overlap partially with the common electrode line 1 (here overlaps with the second part 22) to form one or more capacitors (when there are a plurality of the first branches 101, the plurality of the first branches 101 respectively overlaps with the second part 22 formed by the hollow-out region 8 and form a plurality of capacitors), this capacitor arrangement structure can release static electricity effectively without damaging the whole of the protected structure 2. By adjusting the distance D from the first branch 101 to the edge of a side of the first part 21 that is close to the first branch 101, a point discharge structure is formed, thereby improving the probability of intercepting static electricity. It should be noted that, the second electrostatic protection circuit in the embodiment can also be applied independently to general metal wires, particularly metal wires having relatively sensitive signals thereon, such as a data line.

Third Embodiment

Figure 4:
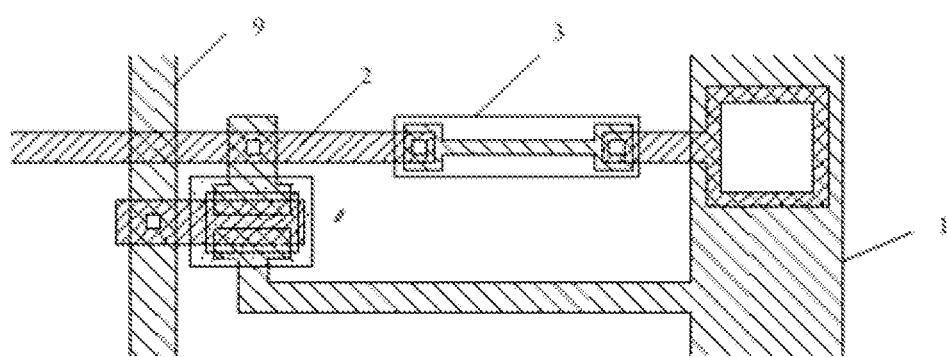
FIG. 4 is a schematic diagram of a third embodiment of the invention.

As shown in FIG. 4, the array substrate includes a common electrode line 1 located in a surrounding region, a protected structure 2 located inside the common electrode line 1, and a shorting bar 3 electrically connected between the protected structure 2 and the common electrode line 1 for releasing static electricity on the protected structure 2. The shorting bar 3 is provided on a side of the common electrode line 1 that is close to a central region of the array substrate. A second electrostatic protection circuit is also electrically connected between the protected structure 2 and the common electrode line 1, and the second electrostatic protection circuit includes at least one TFT (thin film transistor). A source of the TFT is electrically connected to the protected structure 2 and a drain of the TFT is electrically connected to the common electrode line 1, or the drain of the TFT is electrically connected to the protected structure 2 and the source of the TFT is electrically connected to the common electrode line 1 (depending on the TFT is N-type or P-type). A gate of the TFT is connected to a low level signal via the wire 9, so that the TFT is in a normally closed mode. Preferably, when the pixel in the array region of the array substrate is controlled by a switching TFT, the length of channel of the TFT in the second electrostatic protection circuit described here is not greater than the length of channel of the switching TFT in the array region.

When static electricity is generated or accumulated at the shorting bar 3 or the protected structure 2, the static electricity causes the source and the drain of the TFT to be in conduction with each other or broken down. The static electricity diffuses through the common electrode line 1 or the gate of the TFT and the wire 9, thus preventing the protected structure 2 from being damaged by static electricity. Afterwards, the protected structure 2 can operate normally by isolating this TFT. In this way, the second electrostatic protection circuit can release static electricity even if the shorting bar 3 is cut off.

It should be noted that, FIG. 4 shows a case that the common electrode line 1 and the source or drain of the TFT are manufactured in a same process step, however, this is just a schematic diagram used to clearly illustrate the solution of the embodiment. As is known to those skilled in the art, specifically the common electrode line 1 can be manufactured synchronously with the manufacturing of the source or drain of the TFT, or can be manufactured synchronously with the manufacturing of the gate of the TFT, or can be manufactured in other process step; the common electrode line 1 can be manufactured simultaneously with the source or drain of the TFT, can also be electrically connected to the source or drain of the TFT by a via hole, or can be electrically connected to the source or drain in another way, which will not be defined by the embodiment, so it should not be deemed that the embodiment is limited to specific contents disclosed in FIG. 4.

Fourth Embodiment

Figure 5:
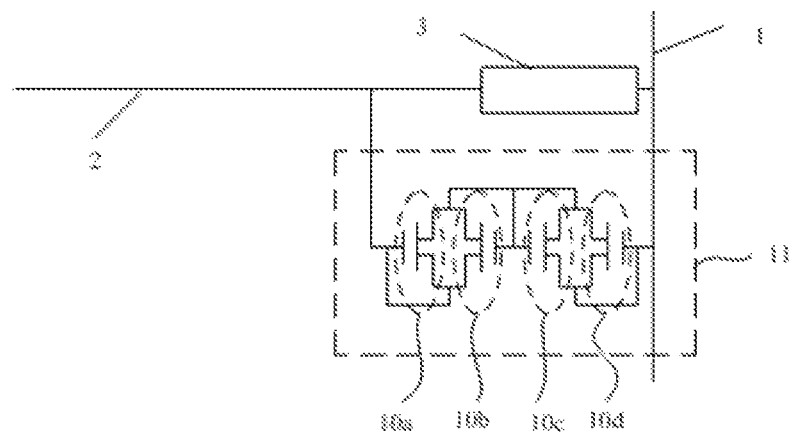
FIG. 5 is a schematic diagram of a fourth embodiment of the invention.

As shown in FIG. 5, the array substrate includes a common electrode line 1 located in a surrounding region, a protected structure 2 located inside the common electrode line 1 and a shorting bar 3 electrically connected between the protected structure 2 and the common electrode line 1 for releasing static electricity on the protected structure 2, and the shorting bar 3 is provided on a side of the common electrode line 1 that is close to a central region of the array substrate. A second electrostatic protection circuit 11 is also electrically connected between the protected structure 2 and the common electrode line 1, and the second electrostatic protection circuit 11 includes a first TFT 10a, a second TFT 10b, a third TFT 10c and a fourth TFT 10d, wherein a source of the first TFT 10a is connected with a source of the second TFT 10b and together connected to a gate of the second TFT 10b; a drain of the first TFT 10a is connected with a drain of the second TFT 10b and together connected to a gate of the first TFT 10a; a source of the third TFT 10c is connected with a source of the fourth TFT 10*d* and together connected to a gate of the third TFT 10*c*; a drain of the third TFT 10*c* is connected with a drain of the fourth TFT 10*d* and together connected to a gate of the fourth TFT 10*d*; the gate of the second TFT 10*b* is connected with the gate of the third TFT 10*c*, the gate of the first TFT 10*a* is connected to the protected structure 2, and the gate of the fourth TFT 10*d* is connected to the common electrode line 1. The second electrostatic protection circuit 11 releases static electricity through the common electrode line 1 after the shorting bar 3 being cut off.

In this embodiment, the shorting bar 3 is placed inside the common electrode line 1, the protected structure 2 is electrically connected to the common electrode line 1 through the second electrostatic protection circuit 11 composed of one or more back-to-back ESD protection structures (the first TFT to the fourth TFT) shown in FIG. 5. When static electricity is accumulated at the shorting bar 3 or the protected structure 2, the static electricity makes the back-to-back ESD protection structure open or work, so that the static electricity diffuses through the common electrode line 1, thereby preventing the protected structure 2 from being damaged by static electricity.

Of course, considering that type of the TFT is divided into P type and N type, the connection relation of the drains and the sources of the first TFT 10*a*, the second TFT 10*b*, the third TFT 10*c* and the fourth TFT 10*d* can be interchanged depending on difference in the type, which will not be described in detail herein.

Fifth Embodiment

Figure 6:
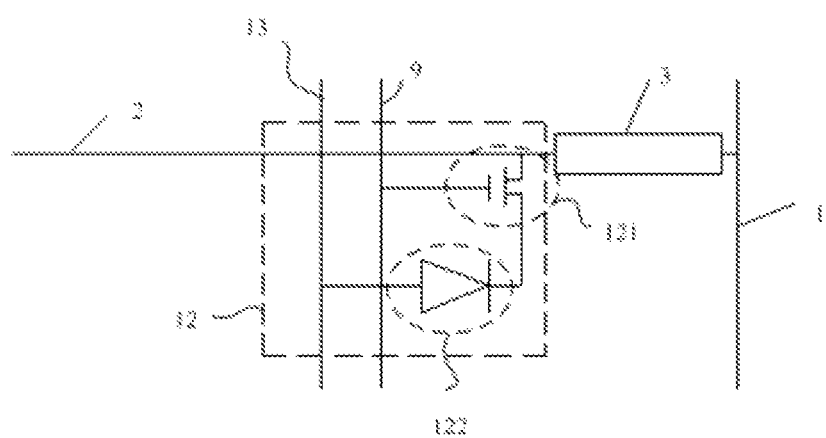
FIG. 6 is a schematic diagram of a fifth embodiment of the invention.

As shown in FIG. 6, the array substrate includes a common electrode line 1 located in a surrounding region, a protected structure 2 located inside the common electrode line 1 and a shorting bar 3 electrically connected between the protected structure 2 and the common electrode line 1 for releasing static electricity on the protected structure 2. The shorting bar 3 is provided on a side of the common electrode line 1 that is close to a central region of the array substrate. A second electrostatic protection circuit is also electrically connected between the protected structure 2 and the common electrode line 1. The second electrostatic protection circuit includes one dummy pixel unit 12. The dummy pixel unit 12 includes one dummy pixel TFT 121 and one dummy pixel diode 122. A source (or drain) of the dummy pixel TFT 121 is electrically connected to the protected structure 2; a drain (or source) of the dummy pixel TFT 121 is electrically connected to a cathode of the dummy pixel diode 122; a gate of the dummy pixel TFT 121 is connected to a low level via a wire 9; an anode of the dummy pixel diode 122 is connected to one dummy pixel common line 13. The dummy pixel common line 13 is electrically connected to the common electrode line 1 on the surrounding region. The common electrode line 1 on the surrounding region is connected to a low level, the second electrostatic protection circuit releases static electricity through the dummy pixel common line 13 or the gate of the dummy pixel TFT 121 and the wire 9 after the shorting bar 3 is cut off.

In the embodiment, the protected structure 2 can be connected to one or more dummy pixel unit 12, and when the panel operates, the gate of the dummy pixel TFT 121 is connected to a low voltage via the wire 9, so that the dummy pixel TFT 121 is closed, and preferably, the length of channel of the dummy pixel TFT 121 is not greater than the length of channel of a pixel switching TFT in the array region. The dummy pixel diode 122 is electrically connected to the dummy pixel common line 13, such that the dummy pixel diode 122 is maintained reverse-biased. When static electricity is generated or accumulated at the shorting bar 3 or the protected structure 2, the static electricity makes the dummy pixel TFT 121 or the dummy pixel diode 122 turned on or broken down, so that the static electricity diffuses through the dummy pixel common line 13 or the gate of the dummy pixel TFT 121 and the wire 9, thereby preventing the protected structure 2 from being damaged by static electricity. Afterwards, the protected structure 2 can operate normally by isolating the dummy pixel unit 12 which is broken down by the static electricity.

In summary, the invention provides an array substrate in which one second electrostatic protection circuit is connected between the common electrode line and the protected structure, thus the conduction of the static electricity accumulated at the shorting bar that has been cut off can be changed from unidirectional conduction toward inside of the array substrate to bidirectional conduction toward inside of the array substrate and edges of the array substrate, thus reducing the probability of electrostatic damage to internal devices of the array substrate; meanwhile, since the location of the second electrostatic protection circuit is closer to the external circuit, it is also possible to achieve preferential releasing of static electricity when the static electricity is conducted into the array substrate from the external circuit, thereby solving the problem of electrostatic damage formed after the shorting bar is cut off.

Accordingly, the invention also provides a panel including the array substrate described in any one of the embodiments described above. The panel can be applied to not only a panel display, but also an image sensor.

It should be noted that, the embodiments above can be learned from each other and used in conjunction with each other. Although the invention has been disclosed by preferred embodiments above, the invention is not limited to the preferred embodiments. Those skilled in the art can make possible variations and modifications to the technical solution of the invention by using the methods and technical contents disclosed above without deviation from the spirit and scope of the invention. Therefore, any alternations, equivalents, and modifications made to the embodiments above according to the technical essential of the invention without departing from the contents of technical solutions of the invention should fall within the scope of protection the technical solutions of the invention.

What is claimed is:

1. An array substrate, comprising:
   a common electrode line located in a surrounding region,
   a protected structure surrounded by the common electrode line, and
   a first electrostatic protection circuit having a shorting bar electrically connected between the protected structure and the common electrode line for releasing static electricity on the protected structure,
   wherein a second electrostatic protection circuit is also electrically connected between the protected structure and the common electrode line, and the second electrostatic protection circuit releases static electricity through the common electrode line after the shorting bar is cut off.

2. The array substrate according to claim 1, wherein the shorting bar is provided on a side of the common electrode line that is far away from a central region of the array substrate, the protected structure overlaps with the common electrode line, the common electrode line comprises at least one hollow-out region in the overlapping region, and the second electrostatic protection circuit comprises at least one capacitor formed by the protected structure and the common electrode line which overlap with each other.

3. The array substrate according to claim 2, wherein the hollow-out region is located on a side of the common electrode line that is far away from the central region of the array substrate, or located in a central region of the common electrode line, or located at edges on both sides of the common electrode line.

4. The array substrate according to claim 1, wherein the shorting bar is provided on a side of the common electrode line that is close to a central region of the array substrate, the common electrode line comprises at least one first branch, and the second electrostatic protection circuit comprises at least one capacitor formed by the at least one first branch and the protected structure which overlap with each other.

5. The array substrate according to claim 4, wherein the protected structure comprises at least one second branch, and the second electrostatic protection circuit comprises at least a capacitor formed by the at least one second branch of the protected structure and the at least one first branch which overlap with each other.

6. The array substrate according to claim 4, wherein the protected structure comprises a hollow-out region, the section of the protected structure that is hollowed out is divided into a first part and a second part by the hollow-out region, the first branch overlaps with the second part and does not overlap with the first part, and the second electrostatic protection circuit comprises a point discharge structure formed by the first part and the first branch.

7. The array substrate according to claim 1, wherein the shorting bar is provided on a side of the common electrode line that is close to a central region of the array substrate, the second electrostatic protection circuit comprises at least one TFT (thin film transistor), a source or drain of the TFT is electrically connected to the protected structure, a drain or source of the TFT is electrically connected to the common electrode line, and a gate of the TFT is connected to a low level.

8. The array substrate according to claim 1, wherein the shorting bar is provided on a side of the common electrode line that is close to a central region of the array substrate, and the second electrostatic protection circuit comprises a first TFT (thin film transistor), a second TFT, a third TFT and a fourth TFT, and wherein:
a source of the first TFT is connected with a source of the second TFT and together connected to a gate of the second TFT;
a drain of the first TFT is connected with a drain of the second TFT and together connected to a gate of the first TFT;
a source of the third TFT is connected with a source of the fourth TFT and together connected to a gate of the third TFT;
a drain of the third TFT is connected with a drain of the fourth TFT and together connected to a gate of the fourth TFT;
the gate of the second TFT is connected with the gate of the third TFT, and
the gate of the first TFT is connected to the protected structure, and the gate of the fourth TFT is connected to the common electrode line.

9. The array substrate according to claim 1, wherein the shorting bar is provided on a side of the common electrode line that is close to a central region of the array substrate, the second electrostatic protection circuit comprises one dummy pixel unit, the dummy pixel unit comprises one dummy pixel TFT (thin film transistor), and one dummy pixel diode, a source or drain of the dummy pixel TFT is electrically connected to the protected structure, a drain or source of the dummy pixel TFT is electrically connected to a cathode of the dummy pixel diode, a gate of the dummy pixel TFT is connected to a low level; an anode of the dummy pixel diode is connected to one dummy pixel common line, the dummy pixel common line is electrically connected to the common electrode line in the surrounding region, the common electrode line is connected to a low level, the second electrostatic protection circuit releases static electricity through the dummy pixel common line or the gate of the dummy pixel TFT after the shorting bar is cut off.

10. A panel, comprising an array substrate, wherein the array substrate comprises:
a common electrode line located in a surrounding region,
a protected structure surrounded by the common electrode line, and
a first electrostatic protection circuit having a shorting bar electrically connected between the protected structure and the common electrode line for releasing static electricity on the protected structure,
wherein a second electrostatic protection circuit is also electrically connected between the protected structure and the common electrode line, and the second electrostatic protection circuit releases static electricity through the common electrode line after the shorting bar is cut off.

11. The panel according to claim 10, wherein the shorting bar is provided on a side of the common electrode line that is far away from a central region of the array substrate, the protected structure overlaps with the common electrode line, the common electrode line comprises at least one hollow-out region in the overlapping region, and the second electrostatic protection circuit comprises at least one capacitor formed by the protected structure and the common electrode line which overlap with each other.

12. The panel according to claim 11, wherein the hollow-out region is located on a side of the common electrode line that is far away from the central region of the array substrate, or located in a central region of the common electrode line, or located at edges on both sides of the common electrode line.

13. The panel according to claim 10, wherein the shorting bar is provided on a side of the common electrode line that is close to a central region of the array substrate, the common electrode line comprises at least one first branch, and the second electrostatic protection circuit comprises at least one capacitor formed by the at least one first branch and the protected structure which overlap with each other.

14. The panel according to claim 13, wherein the protected structure comprises at least one second branch, and the second electrostatic protection circuit comprises at least a capacitor formed by the at least one second branch of the protected structure and the at least one first branch which overlap with each other.

15. The panel according to claim 13, wherein the protected structure comprises a hollow-out region, the section of the protected structure that is hollowed out is divided into a first part and a second part by the hollow-out region, the first branch overlaps with the second part and does not overlap with the first part, and the second electrostatic protection circuit comprises a point discharge structure formed by the first part and the first branch.

16. The panel according to claim 10, wherein the shorting bar is provided on a side of the common electrode line that is close to a central region of the array substrate, the second electrostatic protection circuit comprises at least one TFT (thin film transistor), a source or drain of the TFT is electrically connected to the protected structure, a drain or source of the TFT is electrically connected to the common electrode line, and a gate of the TFT is connected to a low level.

17. The panel according to claim 10, wherein the shorting bar is provided on a side of the common electrode line that is close to a central region of the array substrate, and the second electrostatic protection circuit comprises a first TFT (thin film transistor), a second TFT, a third TFT and a fourth TFT, and wherein:
- a source of the first TFT is connected with a source of the second TFT and together connected to a gate of the second TFT;
- a drain of the first TFT is connected with a drain of the second TFT and together connected to a gate of the first TFT;
- a source of the third TFT is connected with a source of the fourth TFT and together connected to a gate of the third TFT;
- a drain of the third TFT is connected with a drain of the fourth TFT and together connected to a gate of the fourth TFT;
- the gate of the second TFT is connected with the gate of the third TFT, and the gate of the first TFT is connected to the protected structure, and the gate of the fourth TFT is connected to the common electrode line.

18. The panel according to claim 10, wherein the shorting bar is provided on a side of the common electrode line that is close to a central region of the array substrate, the second electrostatic protection circuit comprises one dummy pixel unit, the dummy pixel unit comprises one dummy pixel TFT (thin film transistor), and one dummy pixel diode, a source or drain of the dummy pixel TFT is electrically connected to the protected structure, a drain or source of the dummy pixel TFT is electrically connected to a cathode of the dummy pixel diode, a gate of the dummy pixel TFT is connected to a low level; an anode of the dummy pixel diode is connected to one dummy pixel common line, the dummy pixel common line is electrically connected to the common electrode line in the surrounding region, the common electrode line is connected to a low level, the second electrostatic protection circuit releases static electricity through the dummy pixel common line or the gate of the dummy pixel TFT after the shorting bar is cut off.

* * * * *